United States Patent [19]

Ahuja

[11] Patent Number: 4,675,899
[45] Date of Patent: Jun. 23, 1987

[54] FREQUENCY RING DIRECTOR

[76] Inventor: Om Ahuja, 89 Clearmeadow Dr., East Meadow, N.Y. 11554

[21] Appl. No.: 753,751

[22] Filed: Jul. 10, 1985

Related U.S. Application Data

[63] Continuation-in-part of Ser. No. 633,107, Jul. 20, 1984, abandoned.

[51] Int. Cl.⁴ .................... H04M 1/70; H04M 13/00
[52] U.S. Cl. ..................................... 379/180; 379/387
[58] Field of Search ................. 179/17 E, 17 A, 17 R, 179/17 B, 81 R

[56] References Cited

U.S. PATENT DOCUMENTS

| | | | |
|---|---|---|---|
| 3,916,111 | 10/1975 | Ott | 179/17 E |
| 4,021,617 | 5/1977 | Jones, Jr. et al. | 179/17 E |
| 4,054,942 | 10/1977 | Chambers, Jr. | 179/17 A |
| 4,056,694 | 11/1977 | Brolin | 179/84 R |
| 4,079,205 | 3/1978 | Glenn | 179/17 A |
| 4,099,031 | 7/1978 | Proctor et al. | 179/17 A |
| 4,149,040 | 4/1979 | Atkinson | 179/17 A |
| 4,209,667 | 6/1980 | Simokat | 179/17 A |
| 4,221,935 | 9/1980 | Barsellotti et al. | 179/17 E |
| 4,293,737 | 10/1981 | Cepelinski | 179/17 E |
| 4,310,723 | 1/1982 | Svala | 179/17 A |
| 4,323,799 | 4/1982 | King et al. | 307/571 |
| 4,324,953 | 4/1982 | Simokat | 179/17 A |
| 4,331,838 | 5/1982 | Simokat | 179/17 E |
| 4,373,121 | 2/1983 | Sartori et al. | 179/175.3 F |
| 4,396,809 | 8/1983 | Brunssen | 179/175.3 F |
| 4,403,115 | 9/1983 | Simokat | 179/17 A |
| 4,438,299 | 3/1984 | Tomin | 179/175.3 F |
| 4,445,001 | 4/1984 | Bertoglio | 179/17 A |
| 4,489,221 | 12/1984 | Walker et al. | 179/19 |
| 4,529,847 | 7/1985 | DeBalko | 179/175.3 F |

OTHER PUBLICATIONS

*General Electric*, published by Prentice Hall Inc., N.J. "SCR Manual Sixth Edition" pp. 435–436.
*Bell Laboratories Record*, "Switching to Solid State Relays", pp. 31–37, published in Feb. 1978.
Disclosure Document No. 119121, filed Jul. 27, 1983 for "Maintenance Termination Unit" (per Bell Pub: 55022).

Primary Examiner—Stafford D. Schreyer
Attorney, Agent, or Firm—Scully, Scott, Murphy & Presser

[57] ABSTRACT

A device for selectively ringing a specific party in a multiparty telephone system by frequency discrimination including a remotely actuable solid state switch connected in series with the telephone circuit of each customer. A programmable frequency discriminator is connected across the customer's telephone circuit for opening the solid state switch in response to a ringing voltage. A frequency discriminator produces an output signal in response to the ringing voltage of a selected frequency preprogrammed into the discriminator. The output of the frequency discriminator is connected to an AC to DC to AC converting circuit which is connected within the customer's telephone circuit. The frequency discriminator enables the converting circuit which thereby converts the frequency of the ringing voltage to a standard 20 Hz for ringing the customer's phone.

23 Claims, 6 Drawing Figures

FREQUENCY RING DIRECTOR

CROSS REFERENCE TO RELATED APPLICATIONS

This application is a continuation-in-part of the applicant's pending U.S. application "Remote Actuated Switch" Ser. No. 633,107, filed July 20, 1984, abandoned.

BACKGROUND OF THE INVENTION

1. Field of the Invention:

This invention relates generally to multiparty telephone lines and, particularly, to a device for providing selected ringing of a specific party in a multiparty telephone system. Different ringing frequencies are used to alert only the intended party in the multiparty system of an incoming telephone call.

2. Description of the Prior Art

Multiparty telephone systems involve a number of telephone stations or subscribers which share a single pair of line conductors extending from a central office facility. The line may be seized by any one of the telephone sets of the subscribers to originate an outgoing call. The ringing current for an incoming call is coded in one of several different frequencies to alert the intended receiver of the incoming call. For example, the ringers of a particular subscriber would be resonant to a particular frequency. This prior art party line system requires that the party line customers be provided with phones having specifically designated frequency ringers.

However, in the present deregulated environment it is mandatory that the customer by able to buy and own his own equipment by simply going to any FCC approved manufacturer or supplier for his phone. These phones come either with ringers that will work only on a 20 Hz ringing frequency, or with electronic ringers which will work on any frequency. Therefore, neither of these two phones are suitable as primary ringers in a frequency selected party line environment.

SUMMARY OF THE INVENTION

In order to eliminate the burden of equipment compliance between the subscriber and the operating telephone company, the present invention provides a frequency ring director (FRD) device that is attached in series on the line to the subscriber telephone for intercepting only an incoming call while having no effect on the operation of an outgoing call. The FRD includes a remotely actuable solid state switch connected in series with the tip and ring circuit of each customer. A programmable frequency discriminator is connected across the tip and ring circuit for opening the solid state switch in response to a ringing voltage. The frequency discriminator produces an output signal in response to the ringing voltage of a selected frequency previously programmed into the discriminator. The output of the frequency discriminator is connected to an AC to DC to AC converting circuit which is connected within the tip and ring circuit in parallel to the solid state switch. The frequency discriminator enables the converting circuit to convert the frequency of the ringing voltage to the standard 20 Hz for ringing the customer's phone.

In operation, the device intercepts an incoming ringing voltage, interrogates the frequency of the ringing voltage, while drawing negligible amount of current to perform this task. If the frequency should be within a given permissible percentage of the programmed frequency allocated to the particular subscriber, the ringing voltage is converted to the universally accepted 20 Hz ringing frequency. Thus, the FRD of the present invention enables the use of any standard 20 Hz phone or the more modern phone with an electronic ringer. The FRD device is installed at the customer premises preferably at the demarcation point, between a line protector and the subscriber equipment. The FRD is programmed to accept the frequency assigned to that customer. An FRD is connected in series with each of the customer lines in the multiparty system which are, in turn, all connected in parallel across the central office network circuit. Once this is accomplished, the device provides a significant cost savings by virtue of reduced management of all future equipment, inventory and manpower training.

DETAILED DESCRIPTION OF THE PREFERRED EMBODIMENT

Figure 1:
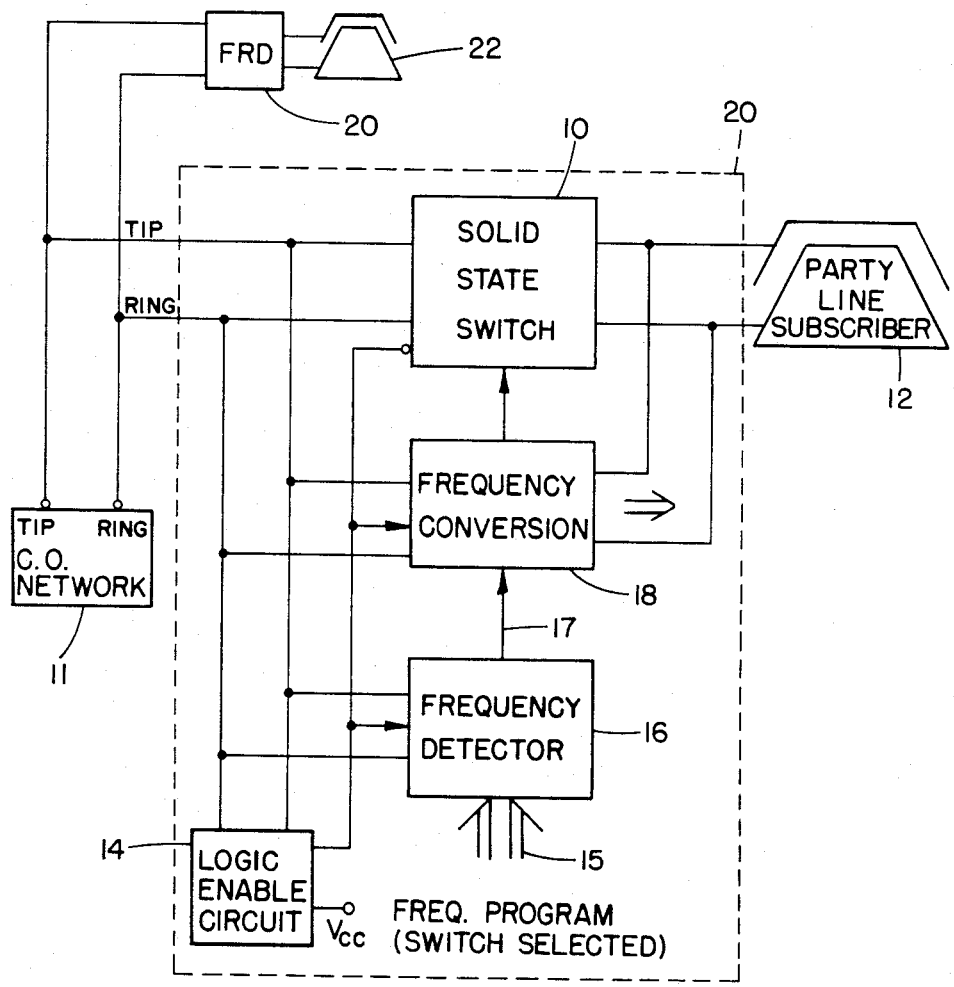
FIG. 1 is a block diagram of a frequency ring director of the present invention.

The FRD of the present invention, as shown in the block diagram of FIG. 1, includes a remotely actuable solid state switch 10 connected in series with the tip and ring circuit of each customer. The switch 10 is connected in series with the tip and ring circuit for one or more subscriber telephone sets 12, and each subscriber tip and ring circuit is in turn connected in parallel with the tip and ring circuit of the central office network 11. The switch 10 is a remote actuable switch similar to the switches described in the applicant's co-pending application Ser. No. 753,704, filed July 10, 1986), also a C-I-P of application Ser. No. 633,107.

A logic enable circuit 14 is connected across the incoming tip and ring circuit for detecting the presence of the ringing voltage. Once detected, the circuit 14 opens the switch 10 and also provides power to all the logic circuits within a frequency discriminator 16 and an AC to DC to AC converting circuit 18, putting the components in a ready state.

The frequency detector 16 is connected across the tip and ring circuit for monitoring the frequency of the ringing voltage provided by the central office. The frequency detector 16 produces an output signal in response to the ringing voltage of a selected frequency previously programmed into the discriminator through switch selection input 15. The output of the frequency discriminator, the enable signal 17, is connected to a frequency converting circuit 18 connected within the customer tip and ring circuit and to the solid state switch 10. The frequency detector 16 enables the converting circuit 18 to convert the frequency of the incoming ringing voltage to the standard 20 Hz and actuates the solid state switch 10 for ringing the customer's phone 12.

The FRD is normally dormant while sitting in series with the subscriber owned equipment. In this dormant state, the device does not draw any stand-by power to energize any part of the circuit. When the subscriber picks up the handset to originate a call, the device permits the call to go through unhindered with the exception of a minimal voltage drop across the switch 10. Further, in the talk mode, which includes both the call originate and call receive modes, the solid state switch 10 is "normally on" and maintains the same characteristic voltage drop across it.

In operation, if there is an incoming call, the central office equipment automatically codes the frequency of the ringing voltage while maintaining the proper RMS voltage for ringing. Several FRD adapters will be connected in parallel to the same multiparty central office tip and ring line and in series with the different customers of the party line system. FIG. 1 shows a two party line where a second FRD 20 is connected to a second party's telephone 22. The number of FRD devices is only limited by the number of subscribers on the multiparty line.

As each of the FRD devices sees the incoming ringing voltage, the logic enable circuit 14 is instantly pumped up by the high voltage on the line which is greater than the normal 48 volt D C talk battery voltage. The enable circuit 14 wakes up all the logic components of the FRD device and also instantly disables the solid state switch 10. Thus, the ringing voltage is prevented from reaching the customer's equipment on the party line. The frequency detector, being powered and awakened by the logic enable circuit 14, immediately proceeds to measure the incoming frequency. If this does not fall within the set limits of the preset frequency of the respective FRD adapter, the frequency detector does not produce the enable signal 17, and the logic continues to hold the solid state switch 10 "off" for the entire ringing period. The ringing period includes the ringing signal superimposed over the normal talk battery and a pause between the rings, with normal talk battery voltage only. The FRD prevents a false trip condition due to an incidental pick up of the receiver by a non-addressed party due to a delay feature built into the logic enable circuit 14. This feature prevents the answering of the line by the non-addressed party and consequent claim by the caller for credit.

Thereafter, should the incoming frequency be within the permitted frequency limits of the programmed FRD adapter, upon command from the frequency detector 16, the incoming ringing energy is converted to DC, stored and then converted to a 20 Hz AC by the converting circuit 18. The frequency converting circuit 18 then actuates the solid state switch 10 and the 20 Hz AC signal is then outputted to the customer equipment 12 to ring the subscriber's phone. The frequency detector 16 continuously monitors the incoming frequency. Thus, in the case of revertive calling, where one party on the same line is trying to call another party on the same line, the caller places the call and returns the receiver back on-hook. The two respective frequency discriminators will then enable their respective AC to AC converting circuits to ring the respective party's phones.

When the customer on the party line has answered the phone, the central office detects the flow of DC loop current characteristic of an off-hook condition and thereafter stops the ringing voltage and connects the caller to the receiver. The FRD at the same time returns to the normally dormant mode. The switch 10 is returned to the normally closed mode, while returning the rest of the circuitry to a dormant state. The same is true for the non-addressed FRD adapters which also return their solid state switches to a normally closed state while the rest of the circuitry is returned to a dormant state. Therefore, the present invention provides a single device placed on a party line to discriminate the incoming frequency of the ringing voltage on the line instead of putting the burden of this function on the customer provided telephone sets and equipment, thereby substantially reducing the complexity, cost and bulk otherwise required of all the customer equipment.

Furthermore, the FRD adapter does not draw any current in its stand-by mode or normal call originate or talk mode. The circuit operates on a minute current drawn off the ringing voltage during the ringing period, without degrading the otherwise normal operation of the system. In addition, the device does not require any external power source for operation and is powered by the normal voltages on the telephone line. The ringing frequency, once verified, is converted to the universal 20 Hz at nearly the same energy level that the signal came in on the line. Therefore, there is no need for an external energy source. Thus, due to the high efficiency and the very low power drawn by the rest of the FRDs on the same line, the total number of ringers permitted by FCC to be attached to telephone line by each subscriber is still maintained at five REN. REN standing for Ringers Equivalency Number.

Figure 2:
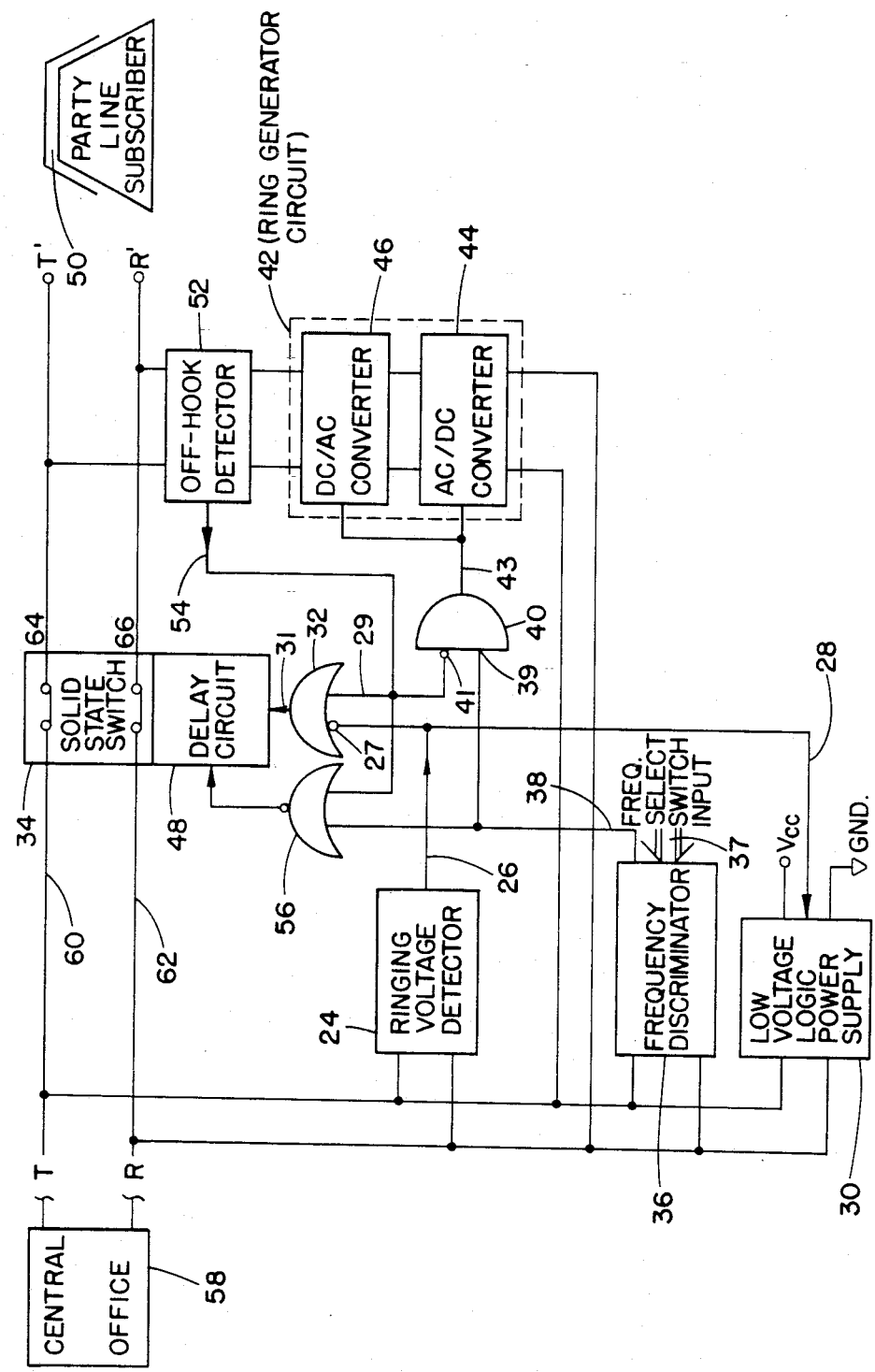
FIG. 2 is a block diagram of another embodiment of the FRD of the present invention.

FIG. 2 illustrates a detailed block diagram of another embodiment of the invention. The ringing voltage detector 24, upon detecting ringing voltage, outputs a signal on line 26 which enables, through line 28, the low voltage logic power circuit 30. The logic power circuit 30 provides the logic power, Vcc to all the elements of the FRD adapter. The signal on line 26 also provides a high to the inverting input 27 of gate 32. In addition, in the on hook condition there will be a low on line 54, which places a low to the noninverting input 29, thereby producing a low at the output 31 of gate 32. A low at 31 turns off the solid state switch 34, thus, preventing the ringing voltage from reaching the subscriber phone 50.

The frequency discriminator 36 simultaneously checks and compares the incoming frequency of the ringing signal to the reference frequency field programmed into the discriminator 36. The discriminator 36 may be programmed by a switch select input 37. If the incoming frequency is within a percentage range pre-set within the frequency discriminator 36, an output signal is provided on line 38. The signal 38 enables a gate 40 which then turns "on" a ring generating circuit 42. The output signal on line 38 provides a high to the noninverting input 39 of gate 40, and coupled with a low on line 54 to the inverting input 41 produces a high output at 43. For every ringing period, this process continues. The ring generating circuit 42 includes an AC to DC converting circuit 44 and a DC to AC converting circuit 46. The AC/DC converting circuit 44 includes voltage doubler. The AC to DC converting circuit includes a 20 Hz ring generator.

The circuit 44 includes a voltage doubler circuit that converts the incoming AC ringing voltage to the DC voltage having a peak value equal to the peak to peak voltage of the incoming AC ringing voltage. This DC voltage is converted to a 20 Hz AC signal by the converter 46. The circuit 46 periodically connects and disconnects the telephone to the DC output of circuit 44 at a 20 Hz rate to energize and de-energize the ringer in the subscriber set, thereby ringing the subscriber's phone.

If the frequency discriminator 36 does not see the selected frequency, the converting circuit 44 as well as the converting circuit 46 remain shut-down while the whole unit draws very low stand-by current. At the same time, a delay circuit 48, part of the solid state switch 34, keeps the switch 34 off during the entire period of the ringing cycle. This feature, as mentioned above, prevents a non-addressed party from answering the phone unintentionally. Preferably, the delay period is set for 6 seconds.

The converting circuit 46 output is passed on to the subscriber phone 50 through an off-hook detector 52 to ring the phone. When the phone is answered, a DC current in excess of nominal ringing current will be detected by the off-hook detector 52 producing a high signal on line 54. The high signal on the line 54 is connected to the inverting input 41 of gate 40 thereby disabling the ring generating circuit 46. The high signal on line 54 from the off-hook detector 52 also closes the solid state switch 34 by putting a high at the input 29 of the gate 32 which produces high at output 31. In addition, the high on line 54 disables the 6 second on-delay 48 through a NOR-gate 56.

The central office internal circuitry detects the off-hook condition of the addressed party line subscriber's phone and ceases the ringing on the line and establishes the call back to the originator. Upon detecting no further ringing voltage, the ringing voltage detector 24 normalizes back the entire circuit to the normal mode. In this normal mode, the solid state switch 34 maintains a normally closed posture, lines 60 and 62 are connected through to lines 64 and 66, respectively. All other parts of the FRD unit remain dormant in the normal mode, while not drawing any power during the on-hook, call originate or talk modes.

Figure 3:
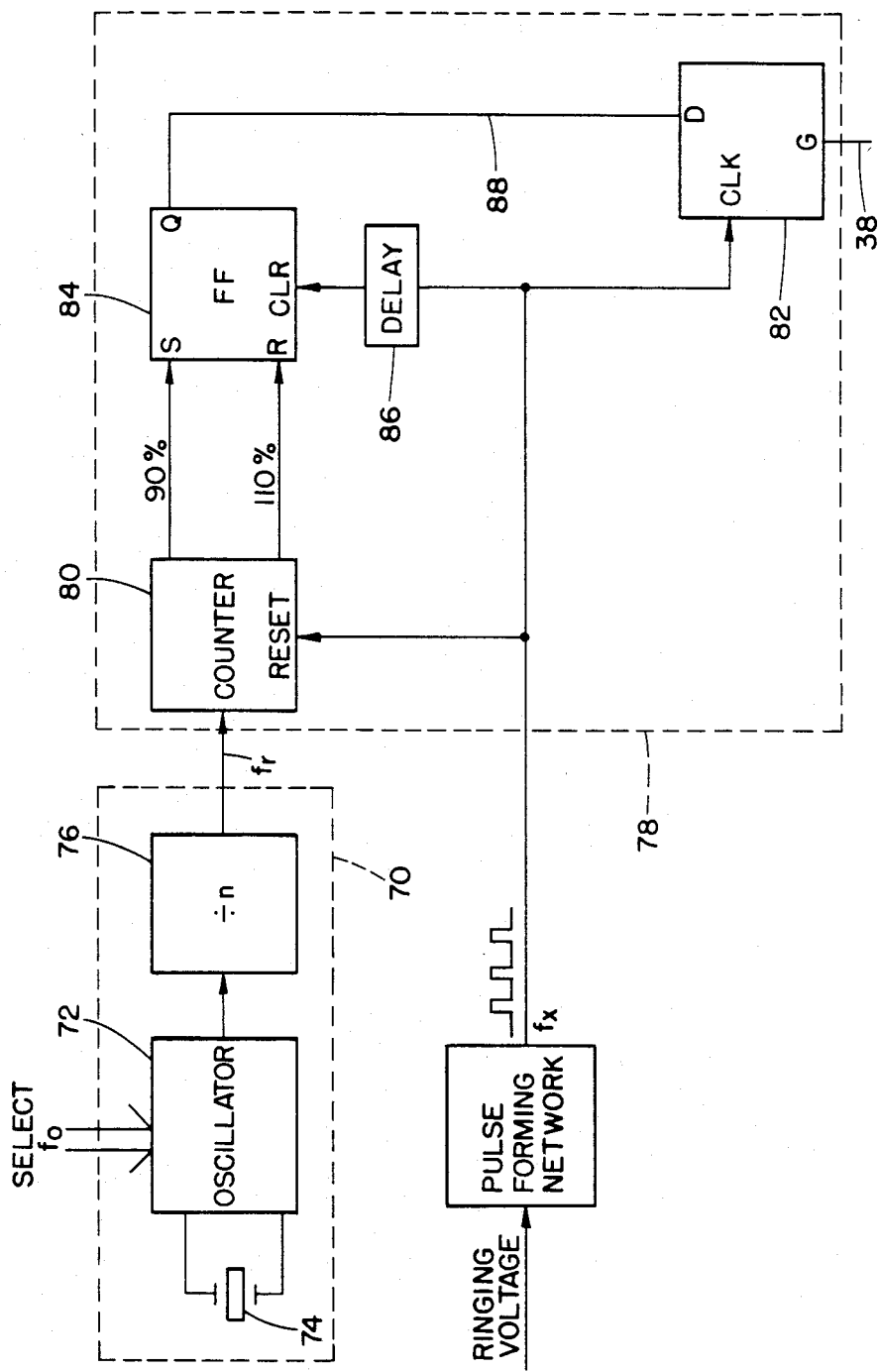
FIG. 3 is a block diagram of one embodiment of the frequency discriminator of the present invention.

FIG. 3 shows one embodiment of the frequency discriminator 36 of the present invention. A pulse forming network 68 converts the incoming ringing voltage into a train of pulses having a spacing corresponding to the frequency $f_x$ of the incoming ringing voltage. A programmable reference signal generator 70 selectively provides a reference signal at a particular reference frequency. In the embodiment shown in FIG. 3, the reference signal generator 70 includes a stable crystal oscillating element 74 providing a time base for the programmable oscillator 72. The programmable oscillator 72, based on the selected input information 71, divides the base frequency so that a signal having the selected frequency $f_o$ is outputted to the fixed multiplier 76. The multiplier 76 then multiplies the selected frequency $f_o$ by a fixed multiple "n" thereby providing an output signal at a reference frequency $f_r$. The reference signal $f_r$ is compared to the input signal $f_x$ by a comparator 78 which produces an output 38 when $f_x$ is within a predetermined percentage range above or below $f_o$. The comparator 78, as shown in FIG. 3, details one embodiment for automatically providing an output for a ringing voltage having a frequency within a percentage deviation of the selected frequency and is best described with reference to its operation.

In operation, the internal stable base programmable oscillator 72 is field programmed by switches or any data storage means to run freely at a frequency $f_o$. The $f_o$ signal is inputted to the multiplier 76 which provides a signal having a frequency $f_r = f_o \times n$, where n is a fixed number for that given circuit design. By way of an example, we will assume that n = 100. Regardless of the frequency chosen, the programmable reference signal generator 70 will produce a signal having frequency $f_r$ which is 100 times faster than the incoming frequency to be accepted. Therefore, if $f_x = f_o$, for every one cycle of $f_o$, 100 cycles at the rate of $f_r$ will be counted by a counter 80. The counter 80 is reset to zero at the beginning of every $f_x$ cycle. However, if $f_x$ is less than $f_o$, then more than 100 cycles will be counted for every $f_x$ cycle, and if $f_x$ is greater than $f_o$, then less than 100 cycles will be counted for every $f_x$ cycle.

In the example, let the constant percentage deviation be 10%. Thus, for $f_x = f_o \pm 10\%$, the ringer should ring. In this case, where n = 100, the FRD unit will allow 90 to 110 counts on the counter 80 for every $f_x$ cycle as acceptable. Thus, every incoming $f_x$ cycle is measured for a fit within the permissible window, and if it passes, a flip-flop 82 with the output 38 is set, and the ring generator 42 in FIG. 2 is enabled while the next cycle is being measured.

At the count of 90, an intermediary set-reset flip-flop 84 is set producing a high in line 88. The flip-flop 84 in the set mode provides a high at the data input of the flip-flop 82. If a trigger pulse derived from the next incoming $f_x$ cycle arrives at the clock input of flip-flop 82 while the flip-flop 84 is in the set mode, a high output will be produced on the output 38 of the flip-flop 82. The incoming frequency is then converted to 20 Hz by the generator circuit 42 of FIG. 2 and customer's phone will ring. However, if 110 counts should arrive before the next incoming $f_x$ trigger pulse, the flip-flop 84 will not be in the set mode and a low data on line 88 will be clocked into the flip-flop 82. Thus, it is determined that $f_x$ is more than 10% below $f_o$.

Similarly, if the trigger pulse derived from an income $f_x$ cycle resets the counter 80 before the counter reaches 90 counts, then the set-reset flip-flop 84 will also not be set while the next trigger pulse is present, and therefore, the line 88, the data input to the flip-flop 82, cannot set the output 38 of the flip-flop 82. Thus, it is determined that $f_x$ is more than 10% above $f_o$. In the later two situations, the ring generator circuit 42 is not enabled thereby preventing the customer's phone from ringing. In each of the above cases each trigger pulse resets the counter 80 and through a delay circuit 86 clears the flip-flop 84, recycling the counter 78. The delay circuit provides a sufficient delay for the data on line 88 to be clocked into flip-flop 82. The on-delay circuit 48 remains activated and maintains the switch 34 in the off mode.

Figure 4A:
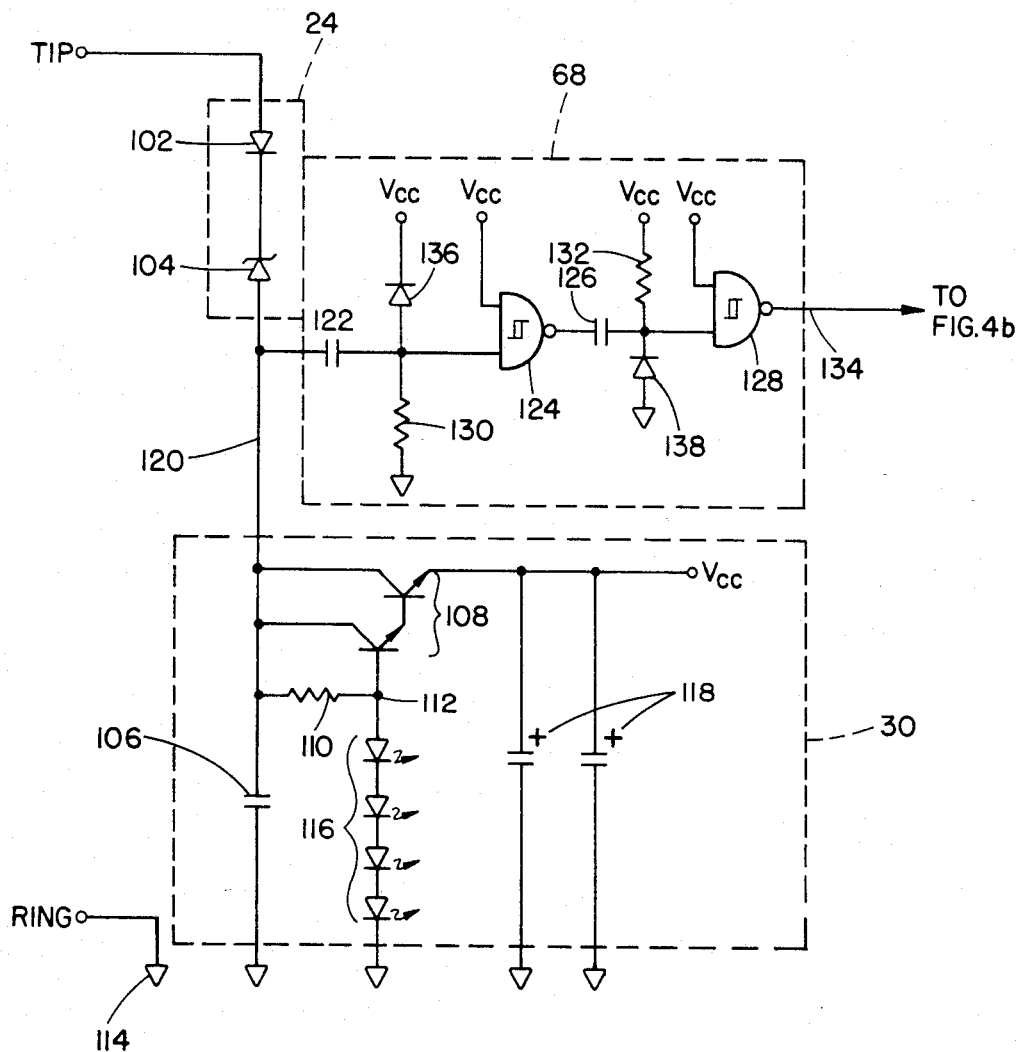
FIGS. 4a, 4b and 4c together form a schematic diagram of one embodiment of the FRD of the present invention.
Figure 4B:
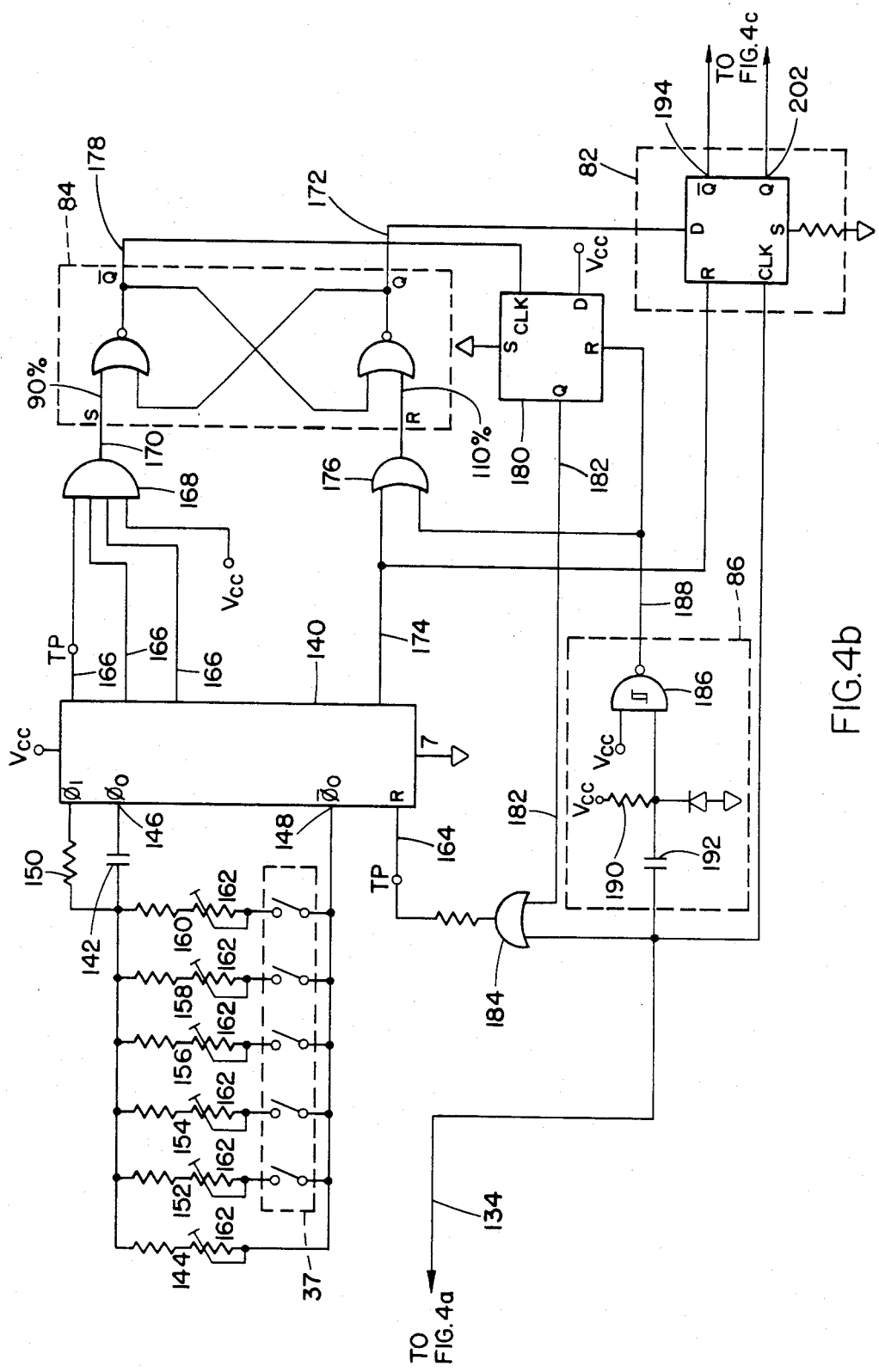
Figure 4C:
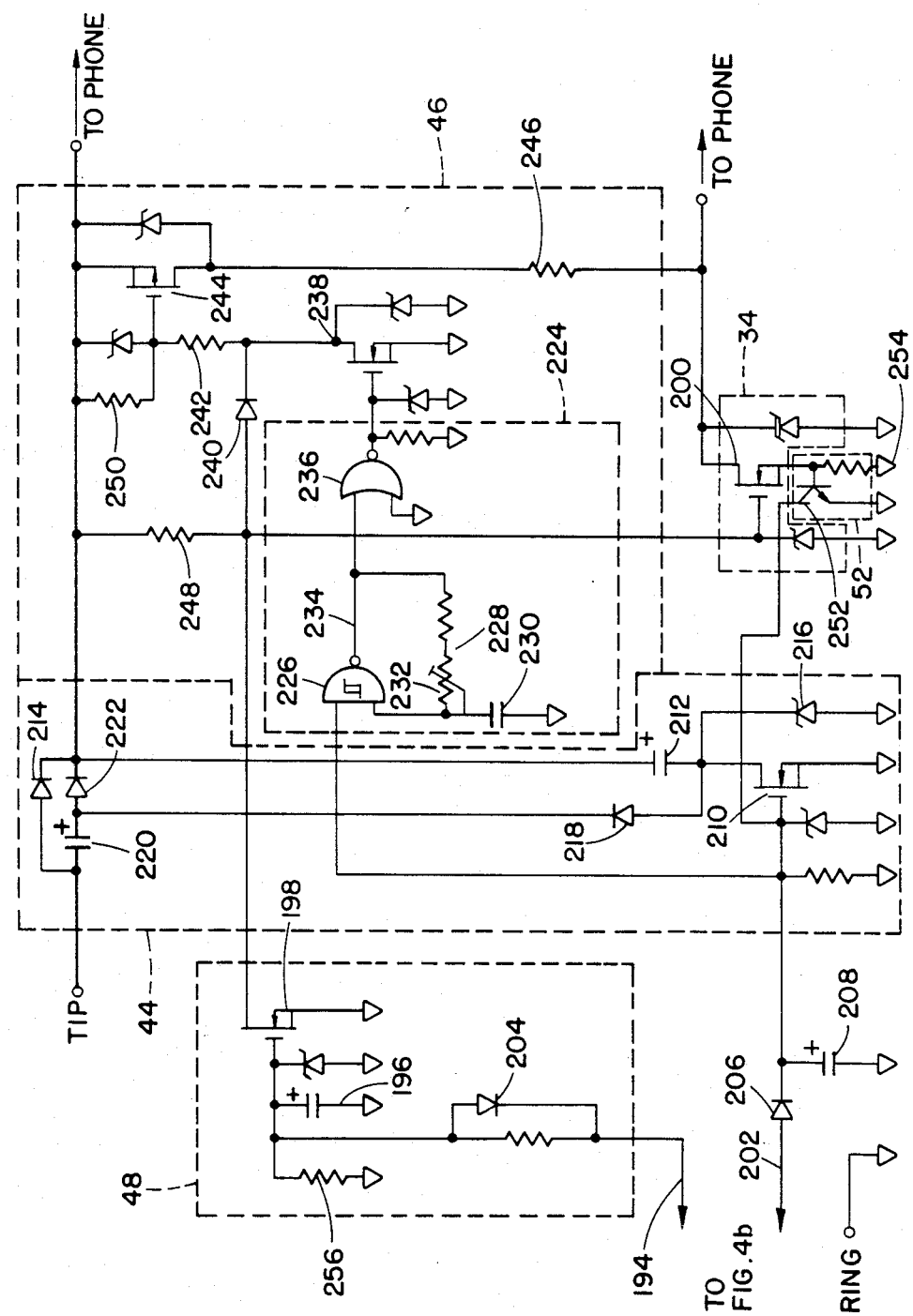

FIGS. 4a, 4b and 4c together are a schematic diagram of an illustrative embodiment of the FRD of the present invention. The schematic is separated into three Figures for ease in description with the interconnections between Figures being indicated by the appropriate arrows shown. As mentioned earlier, the central office normally applies 48 volts DC on the tip and ring line, called the talk battery voltage. Normally, tip is positive and ring is negative in the talk battery mode. When ringing a subscriber, the central office superimposes an AC voltage, nominally 200 volts peak to peak, on the talk battery voltage. As shown in FIG. 4a, the ringing voltage detector 24 includes a diode 102 and a zener diode 104 connected in series across the tip and ring line. Both the diode 102 and the zener diode 104 conduct in the direction from tip to ring, only when the voltage across the line is greater than the breakover voltage of the zener diode 104. The breakover voltage of the zener diode 104 is selected to be greater than the talk battery voltage normally on the line but below the normal ringing voltage so that the zener diode will only breakover in the presence of the ringing voltage. Normally, the breakover voltage of zener diode is selected at 100 volts. When the zener diode 104 breaksover, capacitor 106 in the logic power supply circuit 30 begins to charge. The capacitor 106 is the input to the power supply circuit 30.

The circuit 30 includes a Darlington transistor 108 connected between the input capacitor 106 and the output Vcc. A resistor 110 is connected between the capacitor 106 and the base 112 of the Darlington 108. Capacitor 106 is connected between the tip line and logic ground 114 which is connected to the ring line. An avalanche device 116 is connected between the base 112 and the logic ground 114. Capacitors 118 are connected across Vcc and logic ground 114. Whenever the voltage from tip to ring exceeds the break over voltage of the zener diode 104 capacitor 106 will charge to the voltage in excess of the avalanche voltage diode 104. The voltage across 106 in conjunction with the resistor 110 produces a current to the gate 112 to turn on the Darlington 108. Darlington 108 communicates the voltage across capacitor 106 to the output terminal Vcc. The avalanche device 116 limits the voltage communicated to Vcc to the avalanche voltage of the device 116 less the base-emitter voltage of the Darlington 108. Capacitors 118 form a tank capacitor to smooth the output voltage at Vcc. The output at Vcc powers all the logic functions in the device shown in FIGS. 4, 5 and 6.

Also shown in FIG. 4 is the pulse forming network 68 including a capacitor 122 connected to line 120 and to one input of Schmitt- trigger Nand gate inverter 124. The output of Schmitt- trigger inverter 124 is capacitively coupled through capacitor 126 to a second Schmitt- trigger Nand gate inverter 128. Resistor 130 connects the input of gate 124 to logic ground for normally keeping the input low and the output high of the gate 124. The resistor 132 connects the input of inverter 128 to Vcc to normally provide a logic high to the input of inverter 128 and therefore a low at the output 134. Each time the zener diode 104 breaks over due to the ringing voltage, capacitor 122 will charge and momentarily cause the input of inverter 124 to go high for the time period of the RC time constant formed by capacitor 122 and resistor 130. The Schmitt- trigger inverter 124 then produces a negative pulse having a band width corresponding to the time constant of capacitor 122 and the resistor 130. The negative pulse at the output of inverter 124 places a low at the input of Schmitt- trigger inverter 128 for the period according to the time constant of capacitor 126 and resistor 132. Schmitt trigger 128 then produces a positive pulse at the output 134 having a defined band width corresponding to the RC 126, 132 time constant. The diode 136 clamps the voltage at the input of Schmitt- trigger 124 to the Vcc voltage, by conducting the excess voltage of capacitor 122 to Vcc. Diode 138 clamps the negative going pulse to Schmitt-trigger 128 to logic ground.

The output 134 of the pulse forming network 68 is inputted to the frequency discriminator as shown in FIG. 4b. The frequency discriminator includes an integrated circuit 140. IC 140 includes an oscillator and a binary counter. The oscillator may have an RC input or a quartz crystal input. In the illustrative embodiment shown in FIG. 5, the IC 140 is shown with an RC oscillating input. The base frequency of the oscillator is determined by the RC time constant formed by a capacitor 142 and the resistor 144 connected between clock inputs 146 and 148. Resistor 150 is part of the feedback loop for the oscillating circuit. The base frequency of the oscillator may be increased by adding additional resistors 152–160 in parallel to the resistor 144. The oscillating frequency is selected by engaging any of the switches 37 thereby connecting the appropriate resistor into the circuit. The switches 37 are selected to program the individual FRD device to one of the standard frequencies used by the central office to encode the ringing voltage. The resistor connected within the circuit by the selected switch produces a reference frequency that is greater than the select frequency by a fixed multiplier (n).

Reset input 164 of the IC 140 resets the counter to zero. The binary counter counts up at the rate of the oscillator frequency and the outputs 166 reflect the instantaneous count. Appropriate outputs 166 are inputted to AND gate 168 to produce a high at 170 to set the flip-flop 84 when the count reaches a fixed percentage of the multiplier (n) as described earlier with FIG. 3. The output at 170 represents the maximum frequency acceptable for the selected frequency. The output 170 opens the window for the acceptable range of frequencies. The high at output 170 produces a high at the output 172 of flip-flop 84. In the meantime, the counter continues to count until it reaches the upper preset count representing the fixed multiplier for the least acceptable frequency. A high at output 174 resets flip-flop 84 through the OR-gate 176. This resets the output 172 to low and puts the inverting output 178 to high. The high on output 174 closes the window of the acceptable range of frequency. The inverting output 178 clocks the flip-flop 180 producing a high on output 182. Output 182 produces a high at OR-gate 184 producing a high at reset input 164 setting the counter to zero again.

The positive going edge of the pulses from the pulse forming network output 134 clocks the flip-flop 82. The clock then causes the data on line 172 to be entered in the flip-flop 82. The positive pulse on output 134 also places a high to OR-gate 184 which produces a high at the reset input 164 to reset IC 140. At the negative going portion of the pulse on the output 134 the Schmitt-trigger 186 produces a pulse that resets the flip-flop 180 and the flip-flop 84 through the OR-gate 176. The negative going portion of the pulse at the output of Schmitt-trigger 186 indicates the beginning of a new cycle. The pulse width of the pulse train at 134 and at 188 are kept to a minimum to reduce counting error. The RC time constant formed by a resistor 190 and capacitor 192 produce the output 188 at the falling edge of the pulses at 134 and determine the pulse width at the output 188.

FIG. 4c shows the time delaying circuit 48 which is enabled by a normal high at the inverting output 194 from the flip-flop 82. The output 194 is normally high in the absence of the acceptable frequency. The high on output 194 charges the capacitor 196 and turns on the FET 198. The FET 198 shorts the gate of the FET 200 of the solid state switch 34 shutting the switch 200 off and preventing the ringing voltage from reaching the subscriber phone. The Vcc output keeps the 194 output high during the ringing portion of the ringing cycle. However, during the pause between the ring portions of the ringing cycle when Vcc is decaying, the capacitor 196 sustains the FET 198 in the on-state, thereby keeping the FET 200 off during the entire ringing cycle. Thus, the nonaddressed parties having the FRD device will be prevented from unintentionally seizing the line during the time that the addressed party's phone is ringing.

The addressed party's flip-flop 82 will be in a set state due to the clock pulses on 134 arriving during the acceptable window during which 172 is high, thereby producing a high in the output 202 and a low on output 194. The low on 194 through the diode 204 shorts the capacitor 196 turning off the FET 198. The high on the output 202 through the diode 206 charges capacitor 208 and turns on the gate of FET 210. Capacitor 208 similarly sustains the FET 210 in the on-state during the entire ringing cycle.

The FET 210 in the on-state permits the capacitor 212 to be charged by the ringing voltage through the diode 214 during the portion of the ringing voltage where tip is more positive with respect to ring. When the ringing cycle reverses so that ring is more positive with respect to tip, the voltage through zener diode 216 and diode 218 charges the capacitor 220 for that portion of the ringing voltage. Within the next half cycle of the ringing voltage where the tip is again more positive with respect to ring, the voltage doubler function is operable where the voltage across the capacitor 220, added to the incoming voltage portion is superimposed through the diode 222 upon the capacitor 212. Thus, the AC voltage is inverted to a DC voltage having the full peak-to-peak value across capacitor 212. The capacitor 212 acts as the input to the DC to AC converting circuit 46.

Circuit 46 includes a 20 Hz oscillating circuit 224 which is also enabled by the high cross capacitor 208. Schmitt-trigger NAND-Gate 226, enabled by the capacitor 208 in conjunction with the RC circuit formed by resistor 228 and capacitor 230, forms a free running oscillator, which can be set by potentiometer 232 to the desired frequency, preferably 20 Hz. The potentiometer 232 sets the charge and discharge rate of the capacitor 230 for causing the output of gate 226 to oscillate at the desired frequency. The output 234 from the Schmitt-trigger at 226 through the inverted driver 236 drives the FET 238 at the predetermined frequency. Each time the FET 238 is on, the diode 240 shorts the gate of the FET 200 turning the FET 200 off. The resistor 242 places a negative bias on the p-channel FET 244, turning the FET 244 on. The FET 244 being on, permits the ringer capacitor in the subscriber telephone, charged to the talk battery voltage, to discharge through the FET 244 and a resistor 246. Alternately, as the FET 238 turns off, the gate of FET 200 is permitted to turn on again by the voltage across capacitor 212 through the resistor 248. The gate voltage is removed from FET 244 and the resistor 250 discharges the FET 244 turning the FET 244 off. With the FET 200 turned on, the ringer capacitor in the telephone can then be recharged to the voltage across capacitor 212. This alternate charging and discharging due to the oscillator 224 causes the ringer to charge and discharge and ring the ringing mechanism at the 20 Hz rate. Thus, the DC voltage across capacitor 212 is converted to AC of desired frequency across the tip and ring outputs.

The off-hook detector 52, including transistor 252 and a resistor 254 is connected to the FET 200. In the normal ringing mode, with the phone on-hook, ringing current is such that the voltage across resistor 254 is below the base emitter junction voltage of the transistor 252, so that transistor 252 is not in the on-state. However, when the subscriber goes off-hook, the loop current is increased which builds the voltage up across the resistor 254 to bias the base-emitter junction, and turn on the transistor 252. With the transistor 252 on, the gate of the FET 210 is shorted, shutting the FET 210 off, thereby turning off the AC to DC converter 44 and the oscillator 224. With the oscillator 224 disabled, the FET 238 is off, thereby sustaining the solid state switch 34 in the on-state. This, assures that no further ringing is produced by the DC to AC converting circuit. The same off-hook current is detected by the central office, which then removes the ringing voltage from the line. The removal of the ringing voltage removes the Vcc power signal thereby restoring all the logic elements to the dormant state. Capacitor 196 in the delay circuit 48 continues to discharge through the resistor 256 turning off FET 198 thus enabling the respective subscriber sets of the previously non-addressed parties allowing them to come on line if and when needed.

While illustrative embodiments of the subject invention have been described and illustrated, it is obvious that various changes and modifications can be made therein without departing from the spirit of the present invention which should be limited only by the scope of the appended claims.

What is claimed is:

1. A frequency ring director device for use in a multiparty telephone circuit for designating a specific party for an incoming call, said device being connected in series with the tip and ring circuit of said specific party, said device comprising:

solid state switch means connected within said tip and ring circuit;

frequency detector connected across said tip and ring circuit for producing an output signal in response to a ringing voltage of a preselected frequency; and frequency conversion means responsive to the output of said frequency detector for converting said preselected frequency to a universal frequency and for actuating said solid state switch means for ringing said specific party's telephone.

2. A frequency ring director device for use in a multiparty telephone circuit for designating a specific party for an incoming call, said device being connected in series with the tip and ring circuit of said specific party, said device comprising:

a remotely actuable solid state switch connected in series with said tip and ring circuit, a logic enable circuit connected across said tip and ring circuit for opening said solid state switch and for providing power to all logic functions in said device in response to a ringing voltage;

a programmable frequency discriminator connected across said tip and ring circuit being powered by said logic enable circuit for producing an output signal in response to a ringing voltage of a preselected frequency; and a converting circuit means connected within said tip and ring circuit being powered by said logic enable circuit, said converting circuit being enabled by the output of said frequency discriminator for converting the frequency of said ringing voltage to a predetermined frequency for ringing said specific party's telephone.

3. A frequency ring director device for use in a multiparty telephone circuit for designating a specific party for an incoming call, said device being connected in series with the tip and ring circuit of said specific party, said device comprising:

at least one remotely actuable solid state switch connected in series with said tip or ring circuit;

a ringing voltage detector connected across said tip and ring circuit and to said solid state switch for opening said switch in response to a ringing voltage on said telephone circuit;

a programmable frequency discriminator connected across said tip and ring circuit for producing an output signal in response to a ringing voltage of a preselected frequency;

a ring generating circuit connected across said tip and ring circuit being responsive to an output signal from said frequency discriminator for converting the frequency of said incoming ringing voltage to a predetermined frequency for ringing said specific party's telephone; and an off-hook detector connected to said solid state switch and said ring generating circuit for closing said solid state switch and de-energizing said ring generating circuit in response to said specific party answering said incoming call.

4. The frequency ring director of claim 1 further including a low voltage logic enable circuit means connected across said tip and ring circuit for opening said solid state switch and for powering all logic functions of said device.

5. The frequency ring director of claims 2 or 3, wherein said solid state switch includes a delay circuit for maintaining said solid state switch opened or closed during the entire incoming call cycle.

6. The frequency ring director of claim 3 wherein said ring generating circuit includes a circuit means for converting the AC ringing voltage to DC.

7. The frequency ring director of claim 6, wherein said AC to DC converting circuit means includes a voltage doubler.

8. The frequency ring director of claim 3, wherein said ring generating circuit includes a DC to AC converter.

9. The frequency ring director of claim 2 wherein said frequency discriminator provides an output signal in response to a ringing voltage having a frequency within a predetermined range of frequencies above and below said selected frequency.

10. The frequency ring director of claim 9, wherein said frequency discriminator includes a pulse forming network for converting said AC ringing voltage to a train of pulses having a spacing corresponding to the frequency of said ringing voltage.

11. The frequency ring director of claim 10 wherein said frequency discriminator includes a programmable reference signal generator for selectively providing a reference signal at said selected frequency.

12. The frequency ring director of claim 11, wherein said reference signal generator includes a programmable oscillator.

13. The frequency ring director of claim 12, wherein said reference signal generator includes a multiplier for providing said reference signal at a frequency having a fixed multiple of said selected frequency.

14. The frequency ring director of claim 13, wherein said frequency discriminator includes a comparator for comparing the frequency of said reference signal with the frequency of said pulse train and providing a data output when said pulse train has a frequency within a predetermined range of frequencies above and below said selected frequency.

15. The frequency ring director of claim 14, wherein said comparator includes a counter for counting the number of cycles of said reference signal for a time period determined by the spacing between the pulses of said pulse train, said counter being reset by each pulse, said counter setting a first flip-flop at a fixed number of counts below said selected frequency thereby providing a data input to a second flip-flop, said counter resetting said first flip-flop at a fixed number of counts above said selected frequency removing the data input from said second flip-flop, said pulse train being connected to said second flip-flop, each pulse providing a clock for entering the data at the data input of said second flip-flop, whereby said second flip-flop will provide said data output in response to a pulse being received by said second flip-flop while said first flip-flop is set thereby indicating that said incoming call is within the proper range of the selected frequency.

16. The frequency ring director of claim 3, wherein said ringing voltage detector includes a diode and an avalanche device connected in series across the tip and ring circuit, said diode and avalanche device being poled to conduct from tip to ring only when the voltage across tip and ring is greater than the breakover voltage of the avalanche device, said breakover voltage being selected to be above the talk battery voltage but below the ringing voltage.

17. The frequency ring director of claim 4, wherein said low voltage logic power circuit includes a Darlington transistor having an output terminal and a gate for triggering said Darlington transistor, an avalanche device connected between the gate of the Darlington transistor and the ring line, and a circuit means for turning on said Darlington transistor in response to the ringing voltage across tip and ring, whereby the output of said Darlington transistor is limited to the breakover voltage of said avalanche device.

18. The frequency ring director of claims 1 or 3, wherein said solid state switch includes a field effect transistor having source and drain terminals connected in series with the ring line, an avalanche device connected across the first and second terminals of said FET switch, and an avalanche device connected across the gate and source terminals of said FET switch.

19. The frequency ring director of claim 5, wherein said delay circuit includes a resistance-capacitance time constant circuit and a field effect transistor switch connected to said solid state switch, said FET switch being rendered conductive after the expiration of the resistancecapacitance time constant in response to an output from said frequency discriminator.

20. The frequency ring director of claim 18, wherein said off-hook detector includes a transistor having a base connected to the source of said FET switch and a resistor connected between the base and the ring line, said transistor producing a disabling signal to the DC to AC converter means in response to a current produced by the phone being off hook.

21. The frequency ring director of claim 7, wherein said voltage doubler includes a field effect transistor switch having a gate connected to the output of the frequency discriminator for rendering the FET switch conductive between drain and source terminals, said drain and source terminals being connected between tip and ring through a first capacitor for charging the capacitor to the ringing voltage where the tip line is more positive with respect to the ring line, an avalanche device connected in series between the tip and ring lines through a second capacitor, said avalanche device being poled to permit said second capacitor to charge to the ringing voltage where the ring line is more positive with respect to the tip line, and a diode means connecting said second capacitor to said first capacitor to permit said first capacitor to additionally be charged to the voltage of said first capacitor whereby the AC ringing voltage is converted to a DC voltage stored within said first capacitor equal to the full peak-to-peak value of the ringing voltage.

22. The frequency ring director of claim 8, wherein said DC to AC converter includes an oscillator connected between the tip and ring lines for driving a switch means that alternately actuates and de-actuates a second switch means connected to the tip line for permitting the DC voltage from the voltage doubler circuit to pass through the solid state switch means to the customer phone and to discharge the voltage from the customer phone at a predetermined frequency thereby ringing the customer phone.

23. The frequency ring director of claim 10, wherein said pulse forming network includes a pair of Schmitt-trigger NAND gates connected across the tip and ring lines for converting the AC ringing voltage to a train of pulses.

* * * * *

UNITED STATES PATENT AND TRADEMARK OFFICE
CERTIFICATE OF CORRECTION

PATENT NO. : 4,675,899
DATED : June 23, 1987
INVENTOR(S) : Om Ahuja

It is certified that error appears in the above-identified patent and that said Letters Patent is hereby corrected as shown below:

Column 7, line 63: "FIG. 46" should read as --FIG. 4(b)--.

Signed and Sealed this

Twentieth Day of October, 1987

Attest:

DONALD J. QUIGG

*Attesting Officer*    *Commissioner of Patents and Trademarks*